US010908218B2

(12) United States Patent
Katrak

(10) Patent No.: US 10,908,218 B2
(45) Date of Patent: Feb. 2, 2021

(54) BATTERY CELL MANAGEMENT SYSTEM THAT DETECTS DATA MISALIGNMENT BETWEEN BATTERY CELL VOLTAGE VALUES AND BATTERY CELL OVERVOLTAGE FLAGS

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 477 days.

(21) Appl. No.: 16/013,130

(22) Filed: Jun. 20, 2018

(65) Prior Publication Data
US 2019/0041465 A1 Feb. 7, 2019

Related U.S. Application Data

(60) Provisional application No. 62/539,629, filed on Aug. 1, 2017.

(51) Int. Cl.
*G01R 31/36* (2020.01)
*H02J 7/00* (2006.01)
*G01R 31/3835* (2019.01)
*G01R 31/396* (2019.01)

(52) U.S. Cl.
CPC ........ *G01R 31/3648* (2013.01); *H02J 7/0026* (2013.01); *G01R 31/3835* (2019.01); *G01R 31/396* (2019.01)

(58) Field of Classification Search
CPC ............ G01R 31/3648; G01R 31/3835; G01R 31/396; G01R 31/367; G01R 31/392; B60W 10/26; B60W 20/13; B60W 20/00; H02J 7/0014; H02J 7/0026

USPC .......... 307/24; 320/104, 107, 112, 128, 134, 320/136; 324/76.11, 426, 433; 341/173; 702/58, 63–64, 85, 184
See application file for complete search history.

(56) References Cited

PUBLICATIONS

U.S. Appl. No. 16/028,092, filed Jul. 5, 2018 entitled Battery Cell Management System.
U.S. Appl. No. 16/031,333, filed Jul. 10, 2018 entitled Battery Management System That Detects Communication Faults.
U.S. Appl. No. 16/032,293, filed Jul. 11, 2018 entitled Battery Management System.
U.S. Appl. No. 16/046,965, filed Jul. 26, 2018 entitled Self-Diagnosing Battery Cell Monitoring System.

*Primary Examiner* — John E Breene
*Assistant Examiner* — Jeffrey P Aiello
(74) *Attorney, Agent, or Firm* — Buckert Patent & Trademark Law Firm PC; John F. Buckert

(57) ABSTRACT

A battery management system having a microcontroller with first and second applications and first and second tables is provided. The first table has a first record with a first encoded channel index and a first battery cell voltage value associated with a first battery cell. The second table has a first record with a first encoded channel index and a first battery cell overvoltage flag associated with the first battery cell. The first application sends the first encoded channel index from the first table to the second application. The second application transitions a contactor to an open operational position, when the first encoded channel index from the first table is not equal to a first predetermined encoded channel index indicating a data misalignment of the first battery cell voltage value and the first battery cell overvoltage flag.

11 Claims, 14 Drawing Sheets

US 10,908,218 B2

BATTERY CELL MANAGEMENT SYSTEM THAT DETECTS DATA MISALIGNMENT BETWEEN BATTERY CELL VOLTAGE VALUES AND BATTERY CELL OVERVOLTAGE FLAGS

CROSS-REFERENCE TO RELATED APPLICATION

This application claims priority to U.S. Provisional Patent Application No. 62/539,629 filed on Aug. 1, 2017, the entire contents of which are hereby incorporated by reference herein.

BACKGROUND

The inventor herein has recognized a need for an improved battery management system to detect data misalignment between battery cell voltage values (e.g., analog values) and battery cell overvoltage flags (e.g., discrete binary values).

SUMMARY

A battery management system that detects data misalignment of battery cell voltage values and battery cell overvoltage flags in accordance with an exemplary embodiment is provided. The battery management system includes a microcontroller having first and second applications and first and second tables. The first table has a first record with a first encoded channel index and a first battery cell voltage value associated with a first battery cell. The second table has a first record with a first encoded channel index and a first battery cell overvoltage flag associated with the first battery cell. The first application reads the first record of the first table to obtain the first encoded channel index in the first table. The first application sends the first encoded channel index from the first table to the second application. The second application commands the microcontroller to transition a contactor to an open operational position, when the first encoded channel index from the first table is not equal to a first predetermined encoded channel index associated with the first battery cell indicating a data misalignment of the first battery cell voltage value and the first battery cell overvoltage flag.

DETAILED DESCRIPTION

Figure 1:
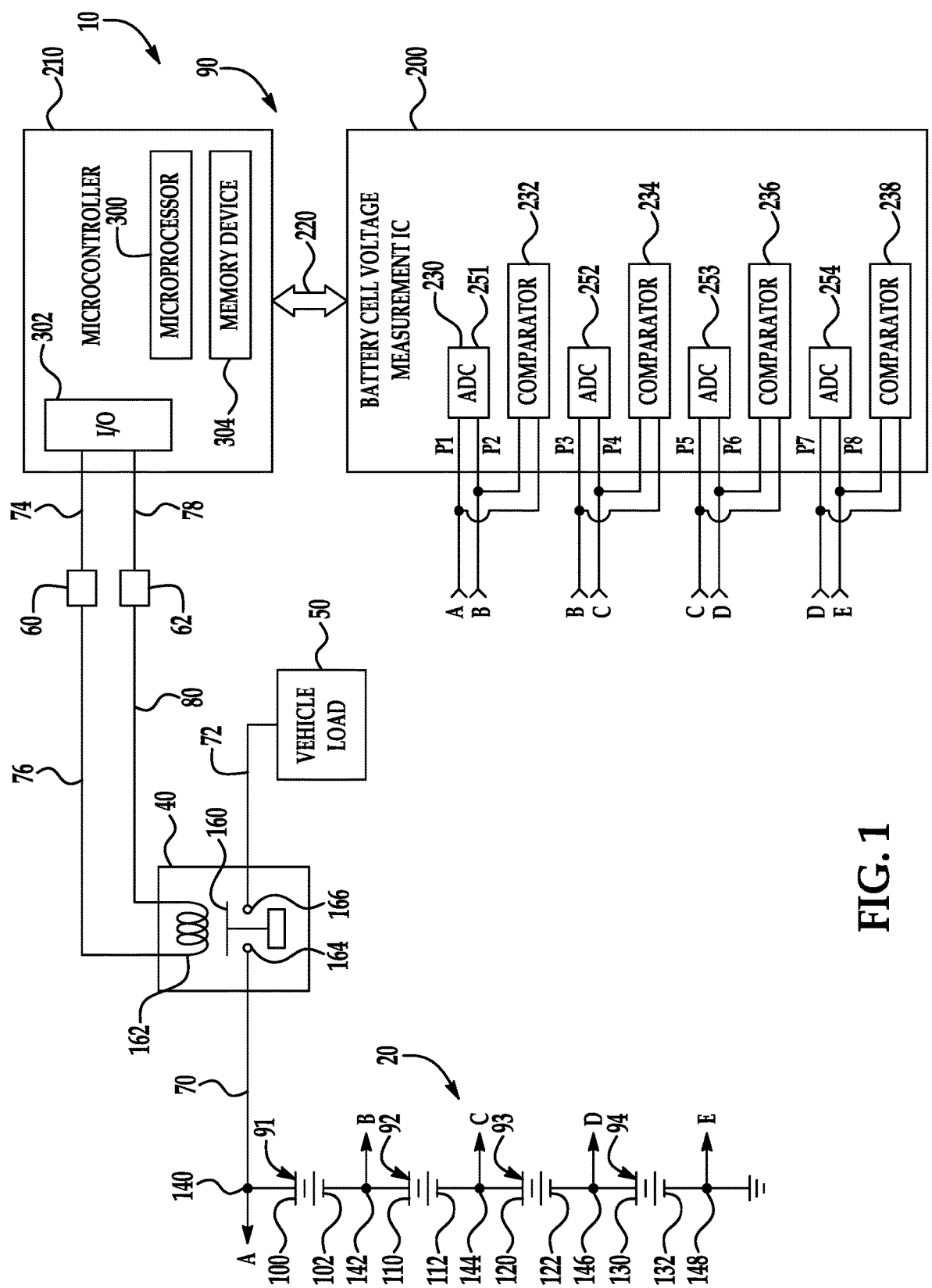
FIG. 1 is a schematic of a vehicle having a battery pack and a battery management system in accordance with an exemplary embodiment.

Referring to FIG. 1, a vehicle 10 is provided. The vehicle 10 includes a battery pack 20, a contactor 40, a vehicle load 50, voltage drivers 60, 62, electrical lines 70, 72, 74, 76, 78, 80, and a battery management system 90.

An advantage of the battery management system 90 is that the battery management system 90 utilizes at least first and second applications that exchange first and second encoded channel indexes, respectively, with one another to detect data misalignment between battery cell voltage values and battery cell overvoltage flags.

For purposes of understanding, a few terms utilized herein will be described.

The term "node" or "electrical node" refers to a region or a location in an electrical circuit.

The term "IC" refers to an integrated circuit.

The term "data misalignment" means that a record having data (e.g., battery cell voltage value) associated with a first device (e.g., first battery cell) in a first table or database is not correctly associated with or correctly indexed with respect to another record having data (e.g., battery cell overvoltage flag) associated with the first device (e.g., first battery cell) in a second table or database. For example, the data misalignment of a battery cell voltage value (in a first record in a first table) and a battery cell overvoltage value (in a second record in the second table) means that the first record having the battery cell voltage value is not correctly associated with or correctly indexed with respect to the second record having the battery cell overvoltage value.

The battery pack 20 includes battery cells 91, 92, 93, 94 that are electrically coupled in series to one another. The battery cell 91 includes a positive terminal 100 and a negative terminal 102, and the battery cell 92 includes a positive terminal 110 and a negative terminal 112. Further, the battery cell 93 includes a positive terminal 120 and a negative terminal 122, and the battery cell 94 includes a positive terminal 130 and a negative terminal 132. The negative terminal 100 is electrically coupled to the positive terminal 110, and the negative terminal 112 is electrically coupled to the positive terminal 120. Further, the negative terminal 122 is electrically coupled to the positive terminal 130, and the negative terminal 132 is electrically coupled to electrical ground.

An electrical node 140 is electrically coupled to the positive terminal 100 of the battery cell 91, and is further electrically coupled to the analog-to-digital converter 230, in the battery cell voltage measurement IC 200. Also, an electrical node 142 is electrically coupled to the positive terminal 110 of the battery cell 92, and is further electrically coupled to the battery cell voltage measurement IC 200. Further, an electrical node 144 is electrically coupled to the positive terminal 120 of the battery cell 93, and is further electrically coupled to the battery cell voltage measurement IC 200. Also, an electrical node 146 is electrically coupled to the positive terminal 130 of the battery cell 94, and is further electrically coupled to the battery cell voltage measurement IC 200. Further, an electrical node 148 is electrically coupled to electrical ground, and is further electrically coupled to the battery cell voltage measurement IC 200.

The contactor 40 has a contact 160, a contactor coil 162, a first electrical node 164, and a second electrical node 166. The first electrical node 164 is electrically coupled to the positive terminal 100 of the battery cell 91 via the electrical line 70. The second electrical node 166 is electrically coupled to the vehicle load 50 via the electrical line 72. A first end of the contactor coil 162 is electrically coupled to the voltage driver 60 via the electrical line 76. The voltage driver 60 is further electrical coupled to the digital input-output device 302 of the microcontroller 210 via the electrical line 74. A second end of the contactor coil 162 is electrically coupled to the voltage driver 62 via the electrical line 80. The voltage driver 62 is further electrically coupled to the digital input-output device 302 of the microcontroller 210 via the electrical line 78.

When the microcontroller 210 generates first and second control signals that are received by the voltage drivers 60, 62, respectively, the contactor coil 162 is energized which transitions the contact 160 to a closed operational state, which results in the vehicle load 50 receiving a voltage from the battery pack 20. Alternately, when the microcontroller 210 generates third and fourth control signals that are received by the voltage drivers 60, 62, respectively, the contactor coil 162 is de-energized which transitions the contact 160 to an open operational state. In an exemplary embodiment, the third and fourth control signals can each be a ground voltage level.

The battery management system 90 is provided to determine battery cell voltage values associated with the battery cells 91, 92, 93, 94, and to determine battery cell overvoltage flags associated with the battery cells 91, 92, 93, 94. The battery management system 90 is further provided to detect data misalignment of the battery cell voltage values and the battery cell overvoltage flags. The battery management system 90 includes a battery cell voltage measurement IC 200, a microcontroller 210, and a communication bus 220.

The battery cell voltage measurement IC 200 is provided to measure battery cell voltages of the battery cells 91, 92, 93, 94 and to generate associated battery cell voltage values. The battery cell voltage measurement IC 200 is further provided to generate battery cell overvoltage flags associated with the battery cells 91, 92, 93, 94. The battery cell voltage measurement IC 200 includes an analog-to-digital converter (ADC) 230, and voltage comparators 232, 234, 236, 238.

The ADC 230 includes ADC differential channels 251, 252, 253, 254 for measuring battery cell voltages of the battery cells 91, 92, 93, 94, respectively.

The ADC differential channel 251 has input pins P1, P2 which are electrically coupled to the positive terminal 100 and the negative terminal 102, respectively, of the battery cell 91 to measure an output voltage of the battery cell 91 between the terminals 100, 102, and the analog-to-digital converter 230 generates a battery cell voltage value based on the measured output voltage.

The ADC differential channel 252 has input pins P3, P4 which are electrically coupled to the positive terminal 110 and the negative terminal 112, respectively, of the battery cell 92 to measure an output voltage of the battery cell 92 between the terminals 110, 112, and the analog-to-digital converter 230 generates a battery cell voltage value based on the measured output voltage.

The ADC differential channel 253 has input pins P5, P6 which are electrically coupled to the positive terminal 120 and the negative terminal 122, respectively, of the battery cell 93 to measure an output voltage of the battery cell 93 between the terminals 120, 122, and the analog-to-digital converter 230 generates a battery cell voltage value based on the measured output voltage.

The ADC differential channel 254 has input pins P7, P8 which are electrically coupled to the positive terminal 130 and the negative terminal 132, respectively, of the battery cell 94 to measure an output voltage of the battery cell 94 between the terminals 130, 132, and the analog-to-digital converter 230 generates a battery cell voltage value based on the measured output voltage.

The voltage comparator 232 is electrically coupled to the input pins P1, P2 of the ADC differential channel 251, and compares the output voltage (between input pins P1, P2) of the battery cell 91 to a voltage comparator threshold voltage. If the output voltage of the battery cell 91 is greater than the voltage comparator threshold voltage indicating a cell overvoltage condition, the voltage comparator 232 sets an associated battery cell overvoltage flag to a binary "1" value (i.e., a fault value). Otherwise, the voltage comparator 232 sets the associated battery cell overvoltage flag to a binary "0" value (i.e., a non-fault value).

The voltage comparator 234 is electrically coupled to the input pins P3, P4 of the ADC differential channel 252, and compares the output voltage (between input pins P3, P4) of the battery cell 92 to a voltage comparator threshold voltage. If the output voltage of the battery cell 92 is greater than the voltage comparator threshold voltage indicating a cell overvoltage condition, the voltage comparator 234 sets an associated battery cell overvoltage flag to a binary "1" value (i.e., a fault value). Otherwise, the voltage comparator 234 sets the associated battery cell overvoltage flag to a binary "0" value.

The voltage comparator 236 is electrically coupled to the input pins P5, P6 of the ADC differential channel 253, and compares the output voltage (between input pins P5, P6) of the battery cell 93 to a voltage comparator threshold voltage. If the output voltage of the battery cell 93 is greater than the voltage comparator threshold voltage indicating a cell overvoltage condition, the voltage comparator 236 sets an associated battery cell overvoltage flag to a binary "1" value (i.e., a fault value). Otherwise, the voltage comparator 236 sets the associated battery cell overvoltage flag to a binary "0" value.

The voltage comparator 238 is electrically coupled to the input pins P7, P8 of the ADC differential channel 254, and compares the output voltage (between input pins P7, P8) of the battery cell 94 to a voltage comparator threshold voltage. If the output voltage of the battery cell 94 is greater than the voltage comparator threshold voltage indicating a cell overvoltage condition, the voltage comparator 238 sets an associated battery cell overvoltage flag to a binary "1" value (i.e., a fault value). Otherwise, the voltage comparator 238 sets the associated battery cell overvoltage flag to a binary "0" value.

The battery cell voltage measurement IC 200 operably communicates with the microcontroller 210 via the communication bus 220. In particular, the battery cell voltage measurement IC 200 sends battery cell voltage values and battery cell overvoltage flags to the microcontroller 210 via the communication bus 220.

The microcontroller 210 is provided to control operation of the contactor 40 and to monitor the battery cell voltage values and the battery cell overvoltage flags associated with the battery cells 91, 92, 93, 94. The microcontroller 210 includes a microprocessor 300, a digital input-output device 302, and a memory device 304. The microprocessor 300 is operably coupled to the digital input-output device 302 and the memory device 304. The digital input-output device 302 is electrically coupled to the voltage drivers 60, 62 via the electrical lines 74, 78, respectively.

Referring to FIGS. 1-4, the memory device 304 includes a main application 400, a first application 401, a second application 402, a third application 403, a fourth application 404, a fifth application 405, a sixth application 406, a seventh application 407, and an eighth application 408 stored therein which is executed by the microprocessor 300. Further, the memory device 304 stores a first table 310 and a second table 312 therein.

Figure 2:
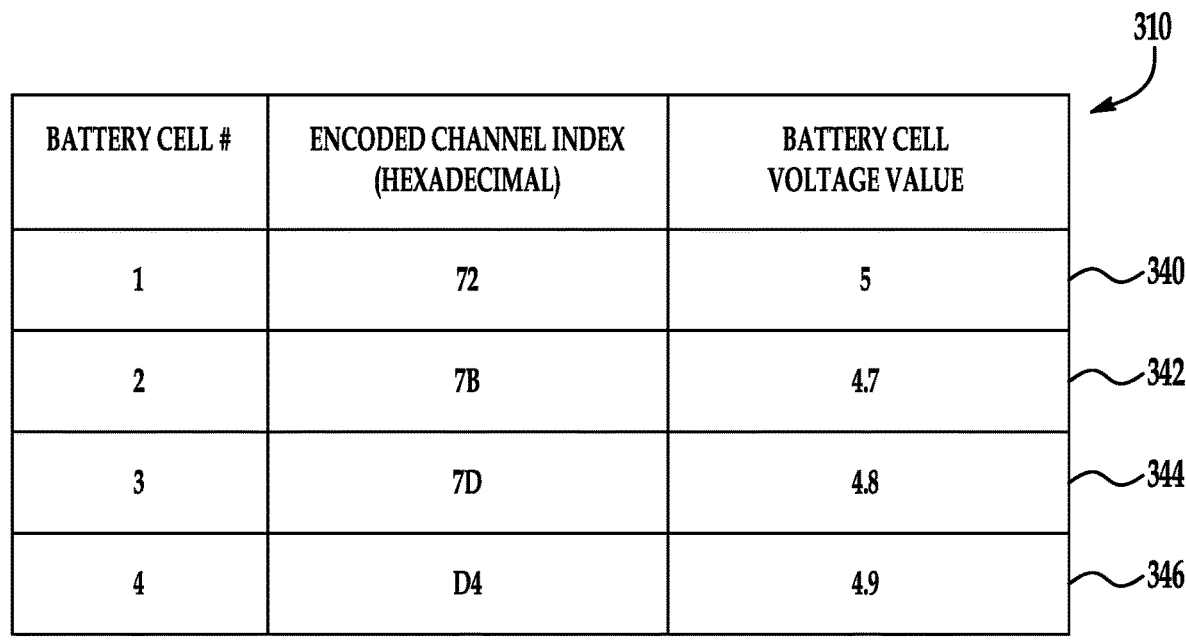
FIG. 2 is a schematic of a first table utilized by the battery management system of FIG. 1.
Figure 3:
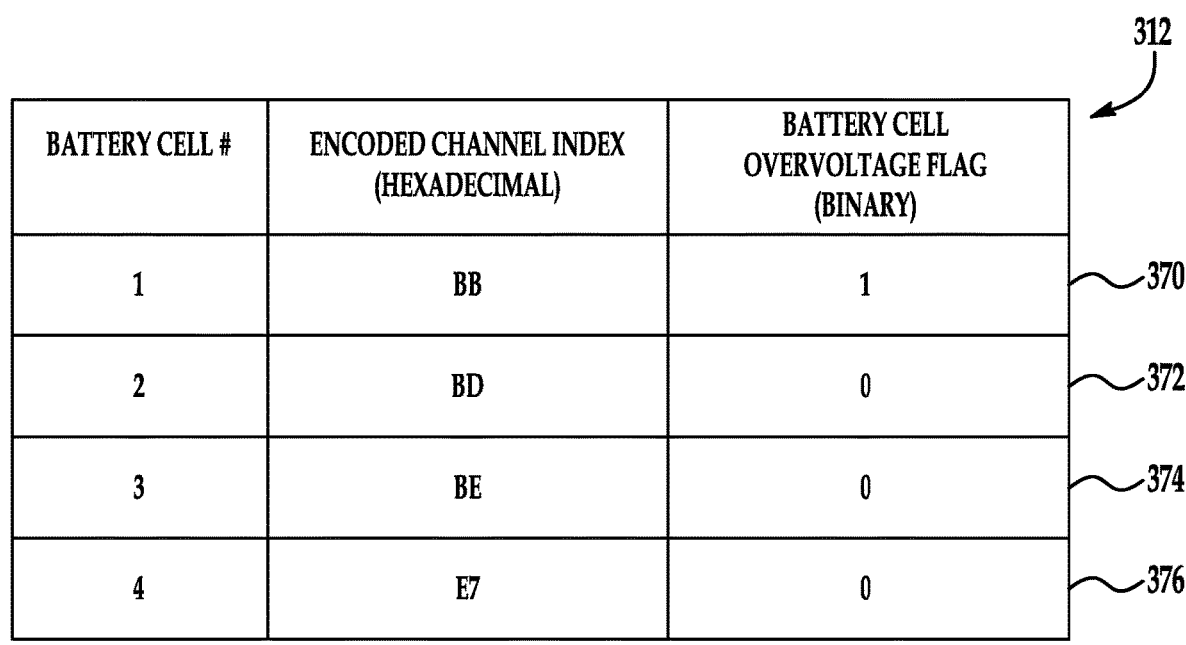
FIG. 3 is a schematic of a second table utilized by the battery management system of FIG. 1.
Figure 4:
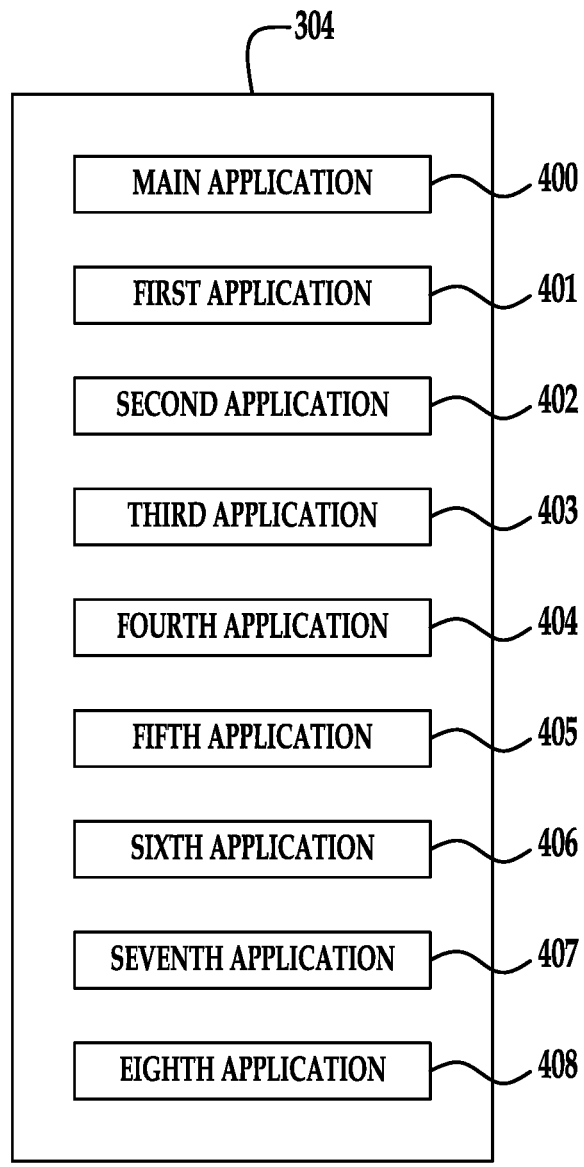
FIG. 4 is a block diagram of a main application, and first, second, third, fourth, fifth, sixth, seventh, and eighth applications utilized by a microcontroller in the battery management system of FIG. 1.
Figure 5:
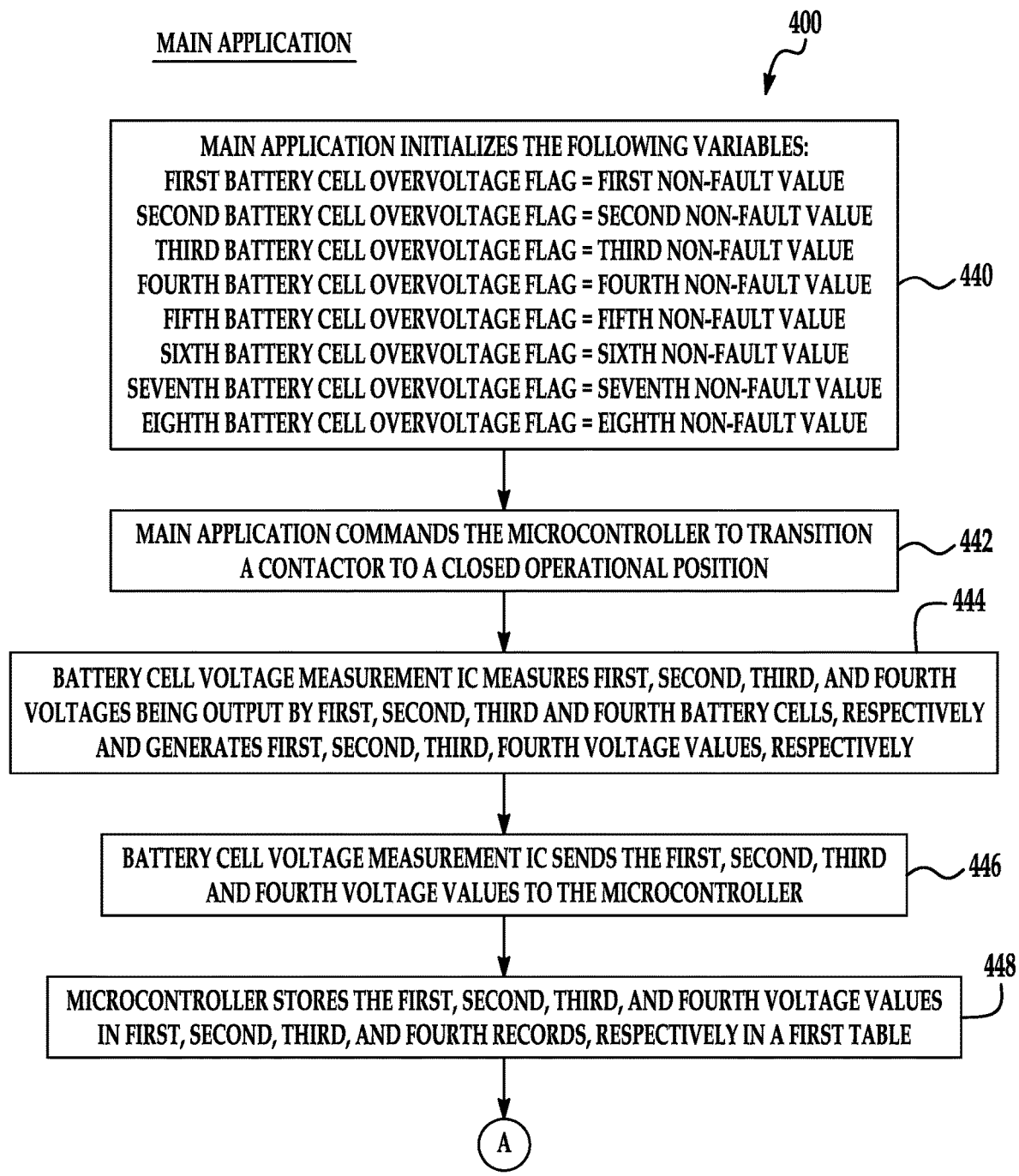
FIGS. 5-15 are a flowchart of a method for detecting data misalignment of battery cell voltage values and battery cell overvoltage flags in accordance with another exemplary embodiment.
Figure 6:
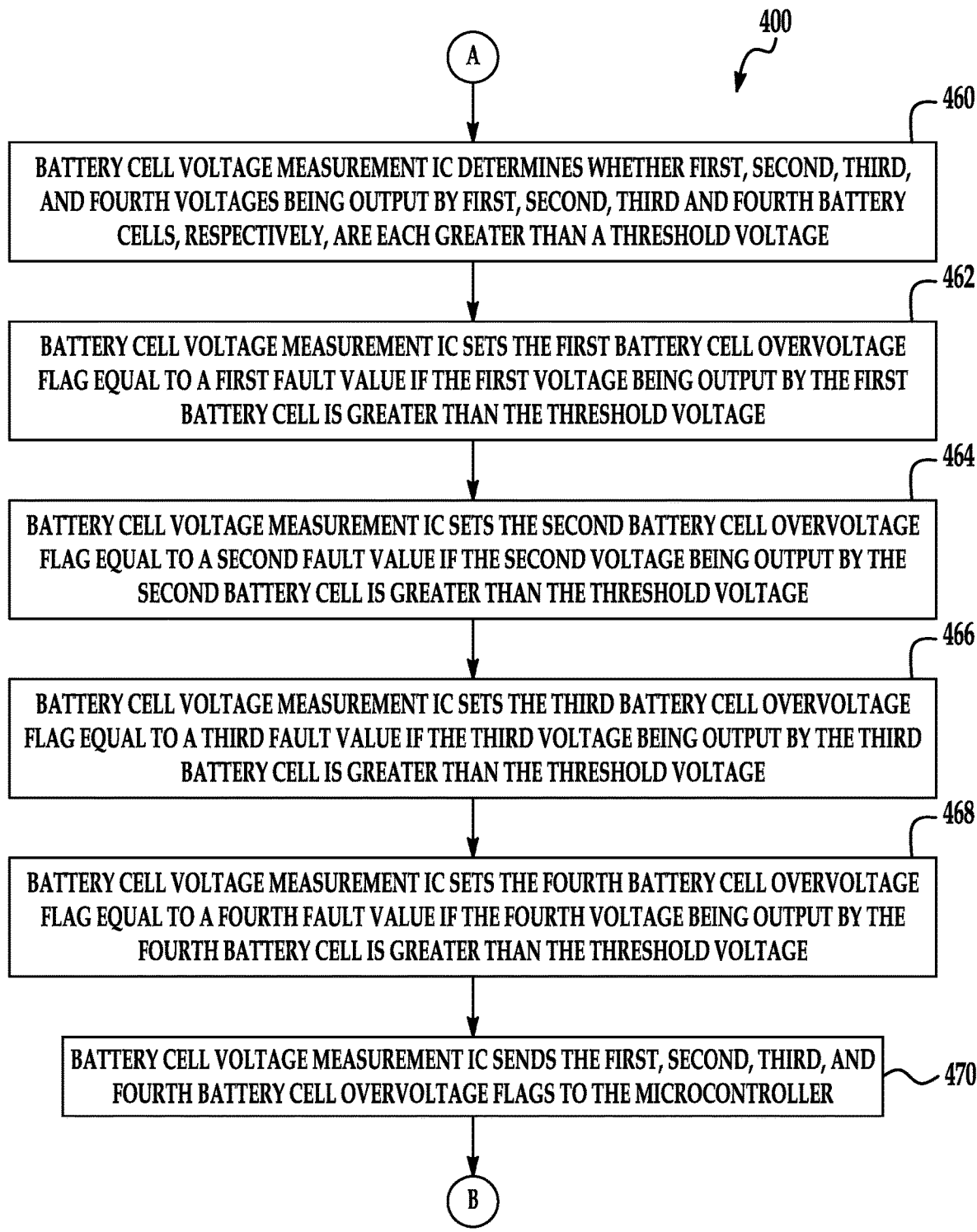
Figure 7:
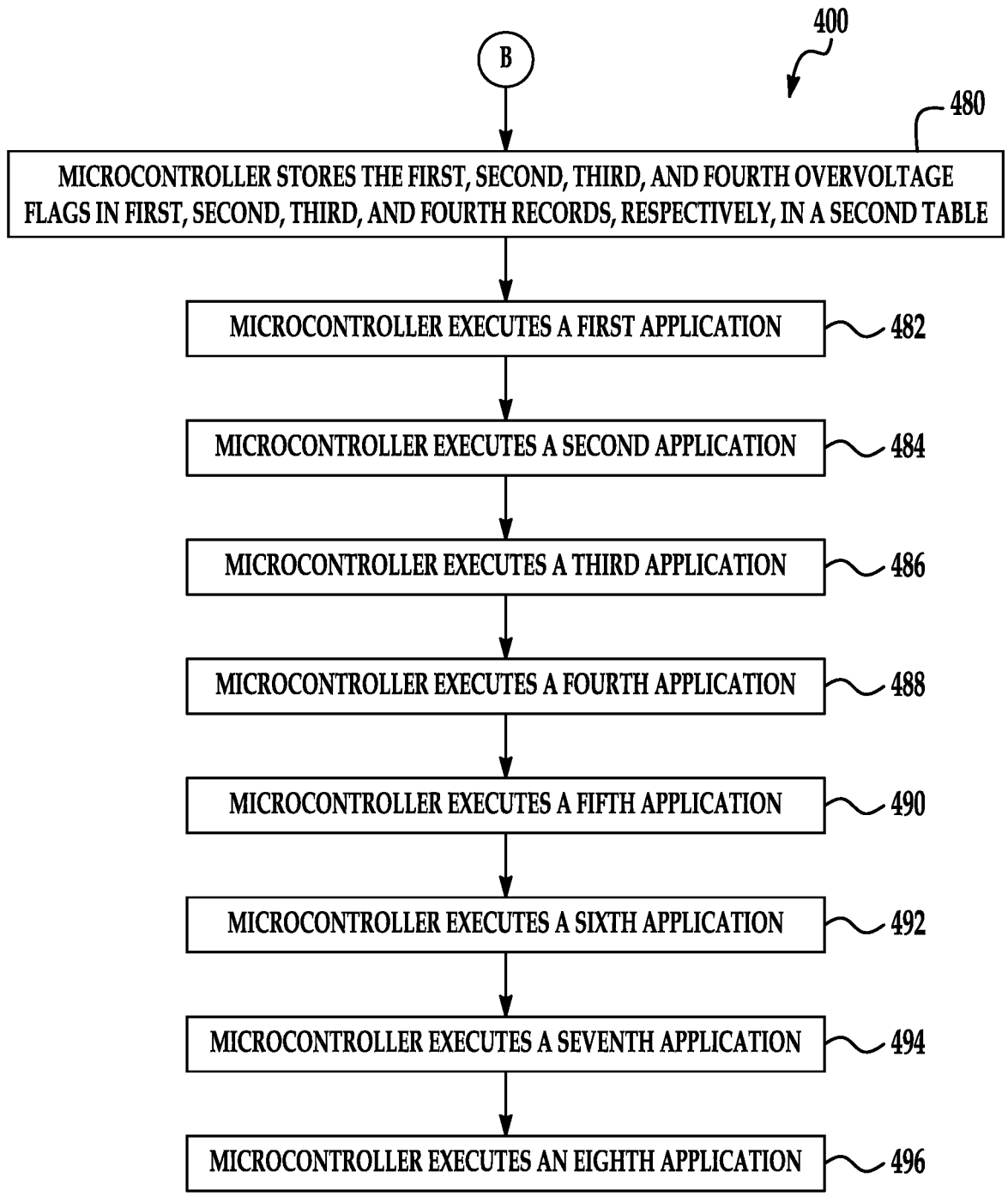

Referring to FIGS. 2 and 3, a brief description of the first table 310 and the second table 312 generated and utilized by the microcontroller 210 will now be explained. The first table 310 includes records 340, 342, 344, 346 each having an encoded channel index (e.g., hexadecimal index) associated with an ADC differential channel and a battery cell, and a battery cell voltage value (e.g., an analog value) obtained by the ADC differential channel. For example, the record 340 includes an encoded channel index of 72 hexadecimal associated with the ADC differential channel 251 and the battery cell 91, and a battery cell voltage value of 5 corresponding to a measured voltage of 5 Vdc. Further, the record 342 includes an encoded channel index of 7B hexadecimal associated with the ADC differential channel 252 and the battery cell 92, and a battery cell voltage value of 4.7 corresponding to a measured voltage of 4.7 Vdc. Also, the record 344 includes an encoded channel index of 7D hexadecimal associated with the ADC differential channel 253 and the battery cell 93, and a battery cell voltage value of 4.8 corresponding to a measured voltage of 4.8 Vdc. Further, the record 346 includes an encoded channel index of D4 hexadecimal associated with the ADC differential channel 254 and the battery cell 94, and a battery cell voltage value of 4.9 corresponding to a measured voltage of 4.9 Vdc. The encoded channel indexes in the records 340, 342, 344, 346 in the first table 310 each have a Hamming distance of at least four from one another.

The second table 312 includes records 370, 372, 374, 376 each having encoded channel index (e.g., hexadecimal index) associated with an ADC differential channel and a battery cell, and a battery cell overvoltage flag obtained from a voltage comparator associated with the ADC differential channel. For example, the record 370 includes an encoded channel index of BB hexadecimal associated with the ADC differential channel 251 and the battery cell 91, and a battery cell overvoltage flag of 1 obtained from the voltage comparator 232. Further, the record 372 includes an encoded channel index of BD hexadecimal associated with the ADC differential channel 252 and the battery cell 92, and a battery cell overvoltage flag of 0 obtained from the voltage comparator 234. Also, the record 374 includes an encoded channel index of BE hexadecimal associated with the ADC differential channel 253 and the battery cell 93, and a battery cell overvoltage flag of 0 obtained from the voltage comparator 236. Further, the record 374 includes an encoded channel index of E7 hexadecimal associated with the ADC differential channel 254 and the battery cell 94, and a battery cell overvoltage flag of 0 obtained from the voltage comparator 238. The encoded channel indexes in the records 370, 372, 374, 376 in the second table 312 each have a Hamming distance of at least four from one another. Further, the encoded channel indexes in the records 370, 372, 374, 376 each have a Hamming distance of at least four from each of the encoded channel indexes in the records 340, 342, 344, 346 in the first table 310.

Referring to FIGS. 1 and 4-15, a flowchart of a method for detecting data misalignment of battery cell voltage values and battery cell overvoltage flags in the first and second tables 310, 312, respectively, will now be described. The flowchart includes the main application 400, the first application 401, the second application 402, the third application 403, the fourth application 404, the fifth application 405, the sixth application 406, the seventh application 407, and the eighth application 408.

Referring to FIGS. 1 and 5-7, the main application 400 will now be explained.

At step 440, the main application 400 initializes the following variables:
first battery cell overvoltage flag=first non-fault value (e.g., 0 binary);
second battery cell overvoltage flag=second non-fault value (e.g., 0 binary);
third battery cell overvoltage flag=third non-fault value (e.g., 0 binary);
fourth battery cell overvoltage flag=fourth non-fault value (e.g., 0 binary);
fifth battery cell overvoltage flag=fifth non-fault value (e.g., 0 binary);
sixth battery cell overvoltage flag=sixth non-fault value (e.g., 0 binary);
seventh battery cell overvoltage flag=seventh non-fault value (e.g., 0 binary);
eighth battery cell overvoltage flag=eighth non-fault value (e.g., 0 binary). After step 440, the method advances to step 442.

At step 442, the main application 400 commands the microcontroller 210 to transition a contactor 40 to a closed operational position. After step 442, the method advances to step 444.

At step 444, the battery cell voltage measurement IC 200 measures first, second, third, and fourth voltages being output by battery cells 91, 92, 93, 94 and generates first, second, third, and fourth voltage values, respectively. After step 444, the method advances to step 446.

At step 446, the battery cell voltage measurement IC 200 sends the first, second, third, and fourth voltage values to the microcontroller 210. After step 446, the method advances to step 448.

At step 448, the microcontroller 210 stores the first, second, third, and fourth voltage values in first, second, third, and fourth records 340, 342, 344, 346 in the first table 310. After step 448, the method advances to step 460.

At step 460, the battery cell voltage measurement IC 200 determines whether first, second, third, and fourth voltages being output by the battery cells 91, 92, 93, 94, respectively, are each greater than a threshold voltage (i.e., voltage comparator threshold voltage). After step 460, the method advances to step 462.

At step 462, the battery cell voltage measurement IC 200 sets the first battery cell overvoltage flag equal to a first fault value if the first voltage being output by the battery cell 91 is greater than the threshold voltage. After step 462, the method advances to step 464.

At step 464, the battery cell voltage measurement IC 200 sets the second battery cell overvoltage flag equal to a second fault value if the second voltage being output by the battery cell 92 is greater than the threshold voltage. After step 464, the method advances to step 466.

At step 466, the battery cell voltage measurement IC 200 sets the third battery cell overvoltage flag equal to a third fault value if the third voltage being output by the battery cell 93 is greater than the threshold voltage. After step 466, the method advances to step 468.

At step 468, the battery cell voltage measurement IC 200 sets the fourth battery cell overvoltage flag equal to a fourth fault value if the fourth voltage being output by the battery cell 94 is greater than the threshold voltage. After step 468, the method advances to step 470.

At step 470, the battery cell voltage measurement IC 200 sends the first, second, third, and fourth battery cell overvoltage flags to the microcontroller 210. After step 470, the method advances to step 480.

At step 480, the microcontroller 210 stores the first, second, third, and fourth overvoltage flags in first, second, third, and fourth records 370, 372, 374, 376, respectively, in the second table 312. After step 480, the method advances to step 482.

At step 482, the microcontroller 210 executes a first application 401. After step 482, the method advances to step 484.

At step 484, the microcontroller 210 executes a second application 402. After step 484, the method advances to step 486.

At step 486, the microcontroller 210 executes a third application 403. After step 486, the method advances to step 488.

At step 488, the microcontroller 210 executes a fourth application 404. After step 488, the method advances to step 490.

At step 490, the microcontroller 210 executes a fifth application 405. After step 490, the method advances to step 492.

At step 492, the microcontroller 210 executes a sixth application 406. After step 492, the method advances to step 494.

At step 494, the microcontroller 210 executes a seventh application 407. After step 494, the method advances to step 496.

At step 496, the microcontroller 210 executes an eighth application 408. After step 496, the method is exited.

Figure 8:
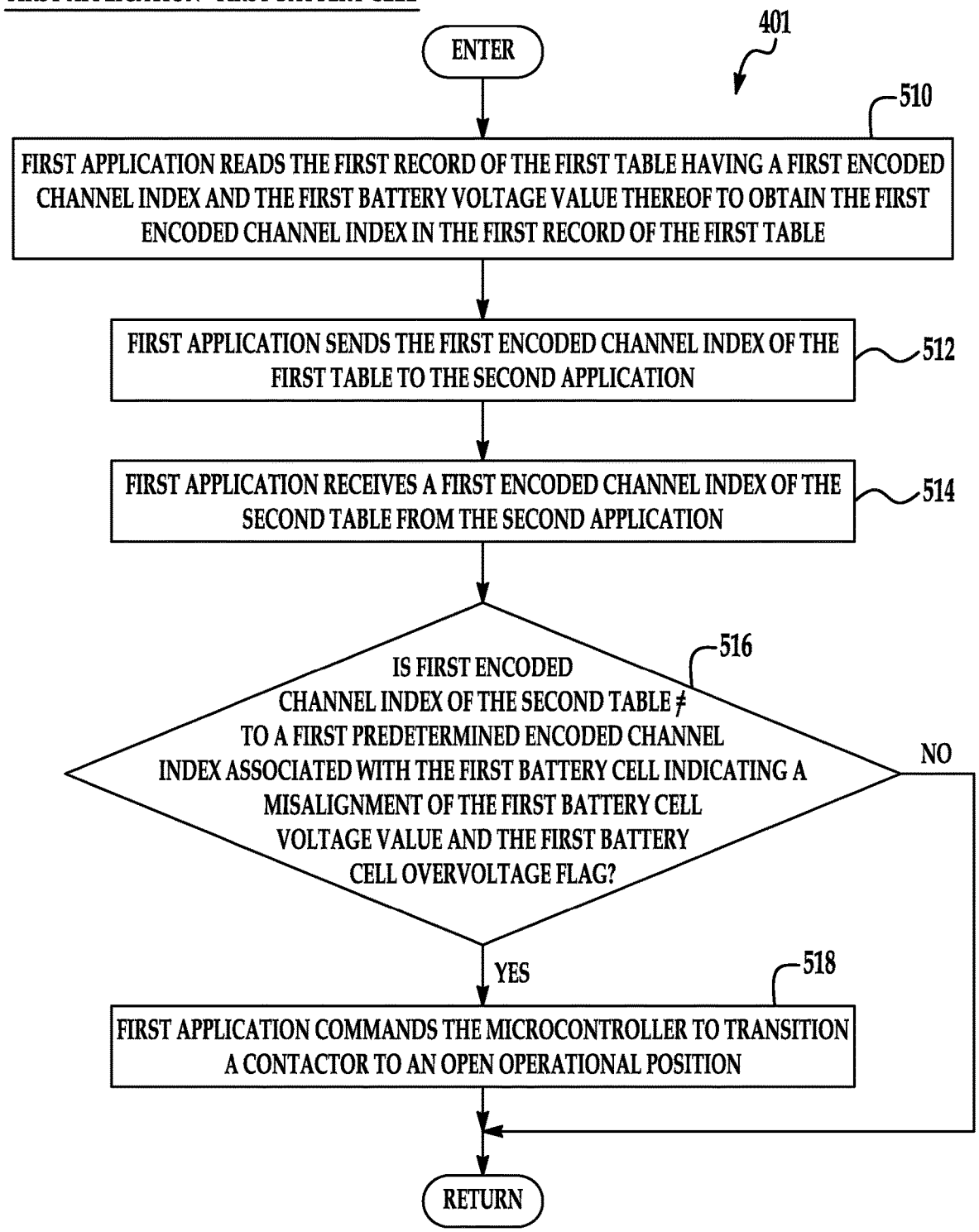

Referring to FIGS. 2 and 8, the first application 401 associated with the battery cell 91 will now be explained.

At step 510, the first application 401 reads the first record 340 of the first table 310 having a first encoded channel index (e.g., 72 hexadecimal) and the first battery voltage value (e.g., 5 decimal) thereof to obtain the first encoded channel index in the first record 340 of the first table 310. After step 510, the method advances to step 512.

At step 512, the first application 401 sends the first encoded channel index (e.g., 72 hexadecimal) of the first table 310 to the second application 402. After step 512, the method advances to step 514.

At step 514, the first application 401 receives a first encoded channel index (e.g., BB hexadecimal) of the second table 312 from the second application 402. After step 514, the method advances to step 516.

At step 516, the first application 401 makes a determination as to whether the first encoded channel index (e.g., BB hexadecimal) of the second table 312 is not equal to a first predetermined encoded channel index associated with the battery cell 91, indicating a misalignment of the first battery cell voltage value (e.g., 5 decimal) and the first battery cell overvoltage flag (e.g., 1 binary). In an exemplary embodiment, the first predetermined encoded channel index is a hard-coded value equal to BB hexadecimal. If the value of step 516 equals "yes", the method advances to step 518. Otherwise, the method returns to the main application 400.

At step 518, the first application 401 commands the microcontroller 210 to transition a contactor 40 to an open operational position. After step 518, the method returns to the main application 400.

Figure 9:
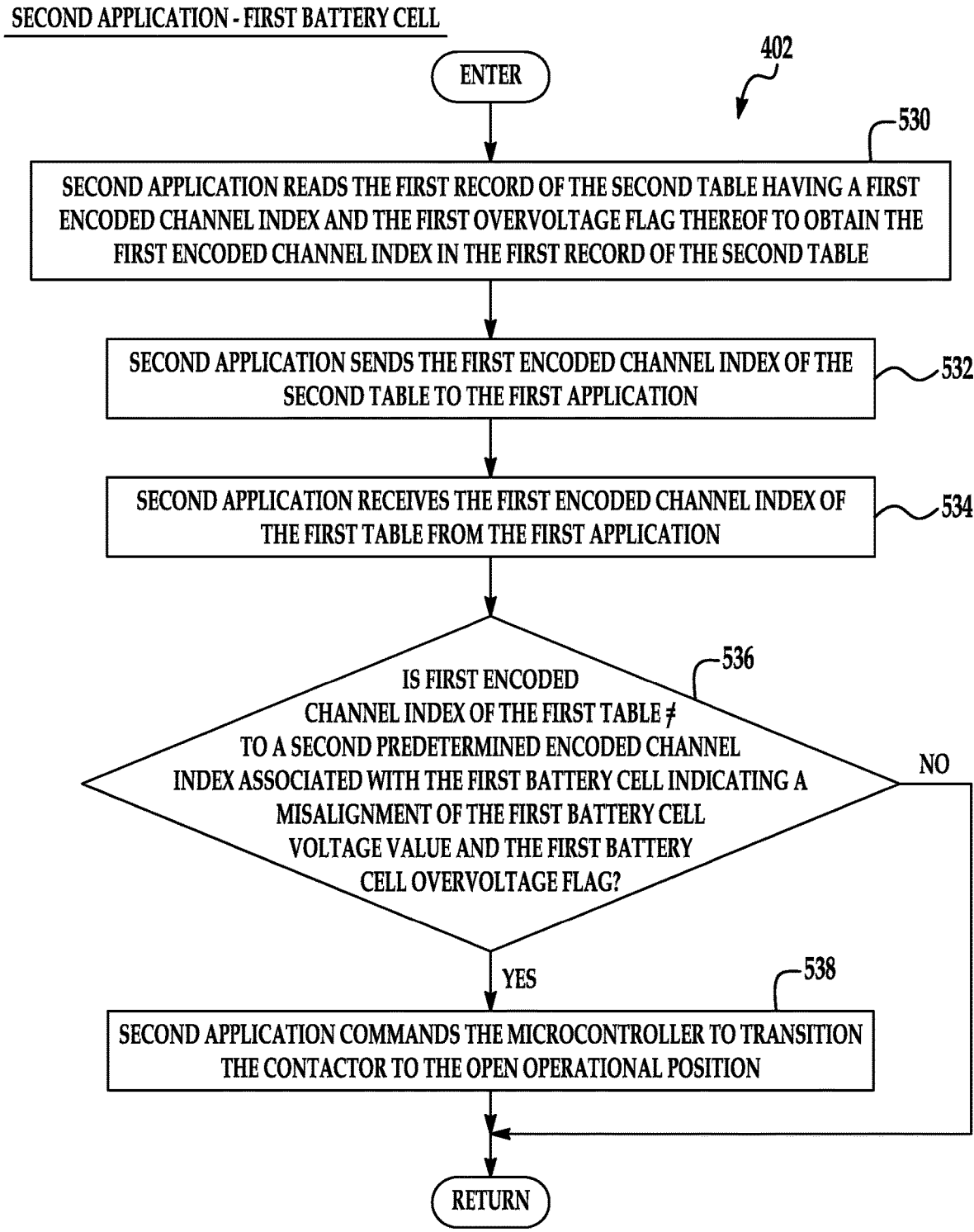

Referring to FIGS. 2 and 9, the second application 402 associated with the battery cell 91 will now be explained.

At step 530, the second application 402 reads the first record 370 of the second table 312 having a first encoded channel index (e.g., BB hexadecimal) and the first overvoltage flag (e.g., 1 binary) thereof to obtain the first encoded channel index in the first record 370 of the second table 312. After step 530, the method advances to step 532.

At step 532, the second application 402 sends the first encoded channel index (e.g., BB hexadecimal) of the second table 312 to the first application 401. After step 532, the method advances to step 534.

At step 534, the second application 402 receives the first encoded channel index (e.g., 72 hexadecimal) of the first table 310 from the first application 401. After step 534, the method advances to step 536.

At step 536, the second application makes a determination as to whether the first encoded channel index (e.g., 72 hexadecimal) of the first table 310 is not equal to a second predetermined encoded channel index associated with the battery cell 91 indicating a misalignment of the first battery cell voltage value (e.g., 5 decimal) and the first battery cell overvoltage flag (e.g., 1 binary). In an exemplary embodiment, the second predetermined encoded channel index is a hard-coded value equal to 72 hexadecimal. If the value of step 536 equals "yes", the method advances to step 538. Otherwise, the method returns to the main application 400.

At step 538, the second application 402 commands the microcontroller 210 to transition the contactor 40 to the open operational position. After step 538, the method returns to the main application 400.

Figure 10:
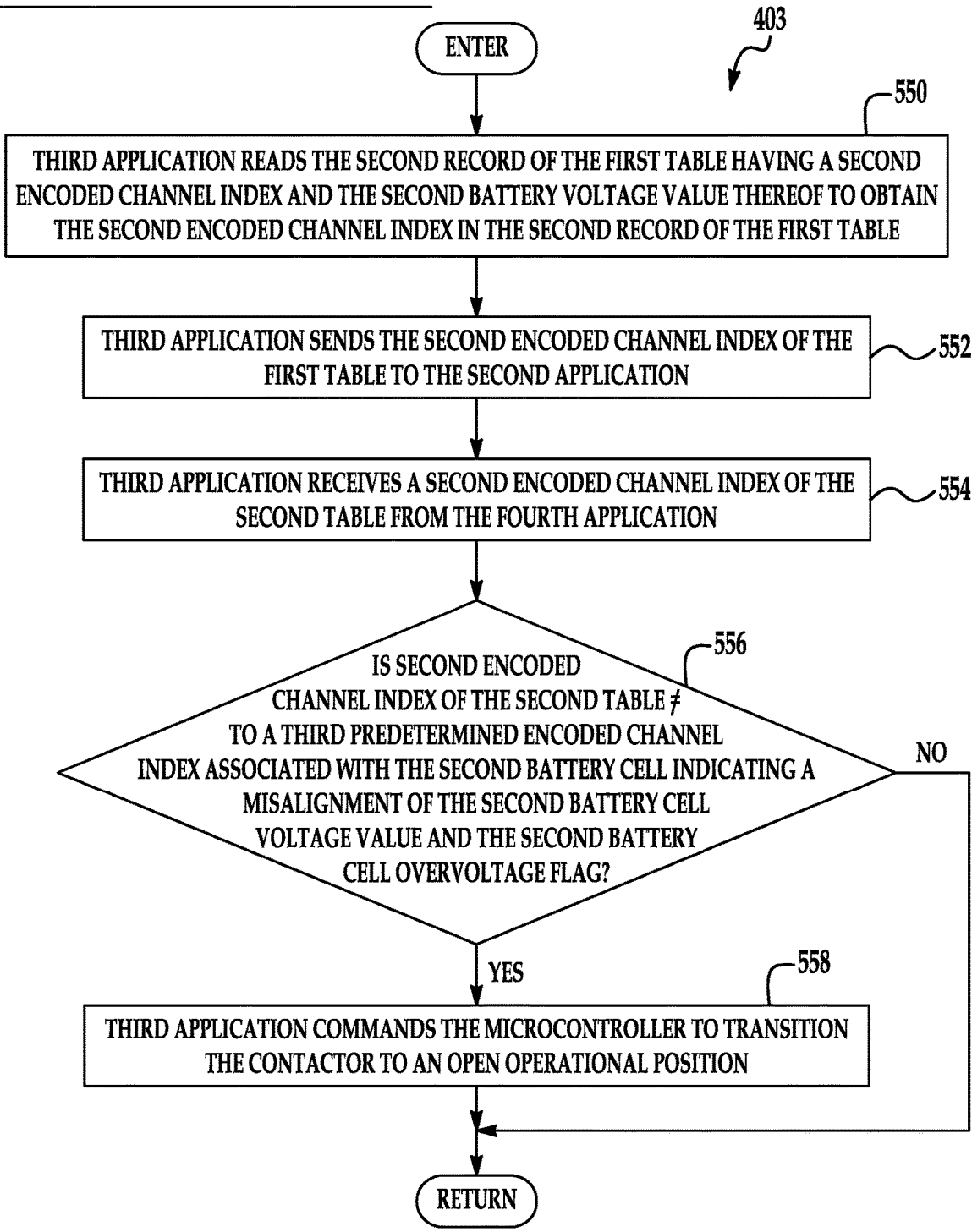

Referring to FIGS. 2 and 10, the third application 403 associated with the battery cell 92 will now be explained.

At step 550, the third application 403 reads the second record 342 of the first table 310 having a second encoded channel index (e.g., 7B hexadecimal) and the second battery voltage value (e.g., 4.5 decimal) thereof to obtain the second encoded channel index in the second record 342 of the first table 310. After step 550, the method advances to step 552.

At step 552, the third application 403 sends the second encoded channel index (e.g., 7B hexadecimal) of the first table 310 to the second application 402. After step 552, the method advances to step 554.

At step 554, the third application 403 receives a second encoded channel index (e.g., BD hexadecimal) of the second table 312 from the fourth application 404. After step 554, the method advances to step 556.

At step 556, the third application 403 makes a determination as to whether the second encoded channel index (e.g., BD hexadecimal) of the second table 312 is not equal to a third predetermined encoded channel index associated with the battery cell 92 indicating a misalignment of the second battery cell voltage value (e.g., 4.7 decimal) and the second battery cell overvoltage flag (e.g., 0 binary). If the value of step 556 equals "yes", the method advances to step 558. Otherwise, the method returns to the main application 400.

At step 558, the third application 403 commands the microcontroller 210 to transition the contactor 40 to the open operational position. After step 558, the method returns to the main application 400.

Figure 11:
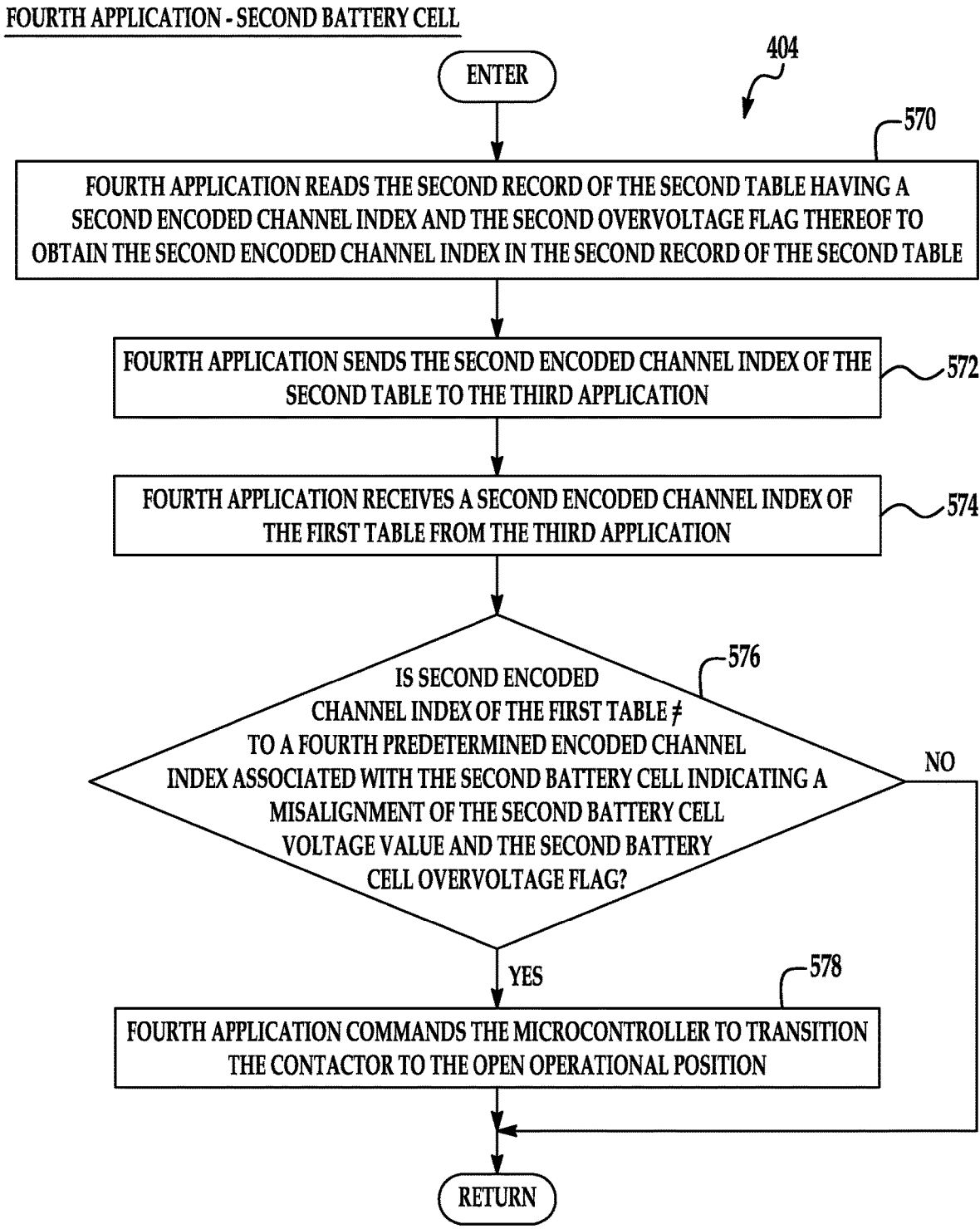

Referring to FIGS. 2 and 11, the fourth application 404 associated with the battery cell 92 will now be explained.

At step 570, the fourth application 404 reads the second record 372 of the second table 312 having a second encoded channel index (e.g., BD hexadecimal) and the second overvoltage flag (e.g., 0 binary) thereof to obtain the second encoded channel index in the second record 372 of the second table 312. After step 570, the method advances to step 572.

At step 572, the fourth application 404 sends the second encoded channel index (e.g., BD hexadecimal) of the second table 312 to the third application 403. After step 572, the method advances to step 574.

At step 574, the fourth application 404 receives the second encoded channel index (e.g., 7B hexadecimal) of the first table 310 from the third application 403. After step 574, the method advances to step 576.

At step 576, the fourth application 404 makes a determination as to whether the second encoded channel index (e.g., 7B hexadecimal) of the first table 310 is not equal to a fourth predetermined encoded channel index associated with the battery cell 92 indicating a misalignment of the second battery cell voltage value (e.g., 4.7 decimal) and the second battery cell overvoltage flag (e.g., 0 binary). If the value of step 576 equals "yes", the method advances to step 578. Otherwise, the method returns to the main application 400.

At step 578, the fourth application 404 commands the microcontroller 210 to transition the contactor 40 to the open operational position. After step 578, the method returns to the main application 400.

Figure 12:
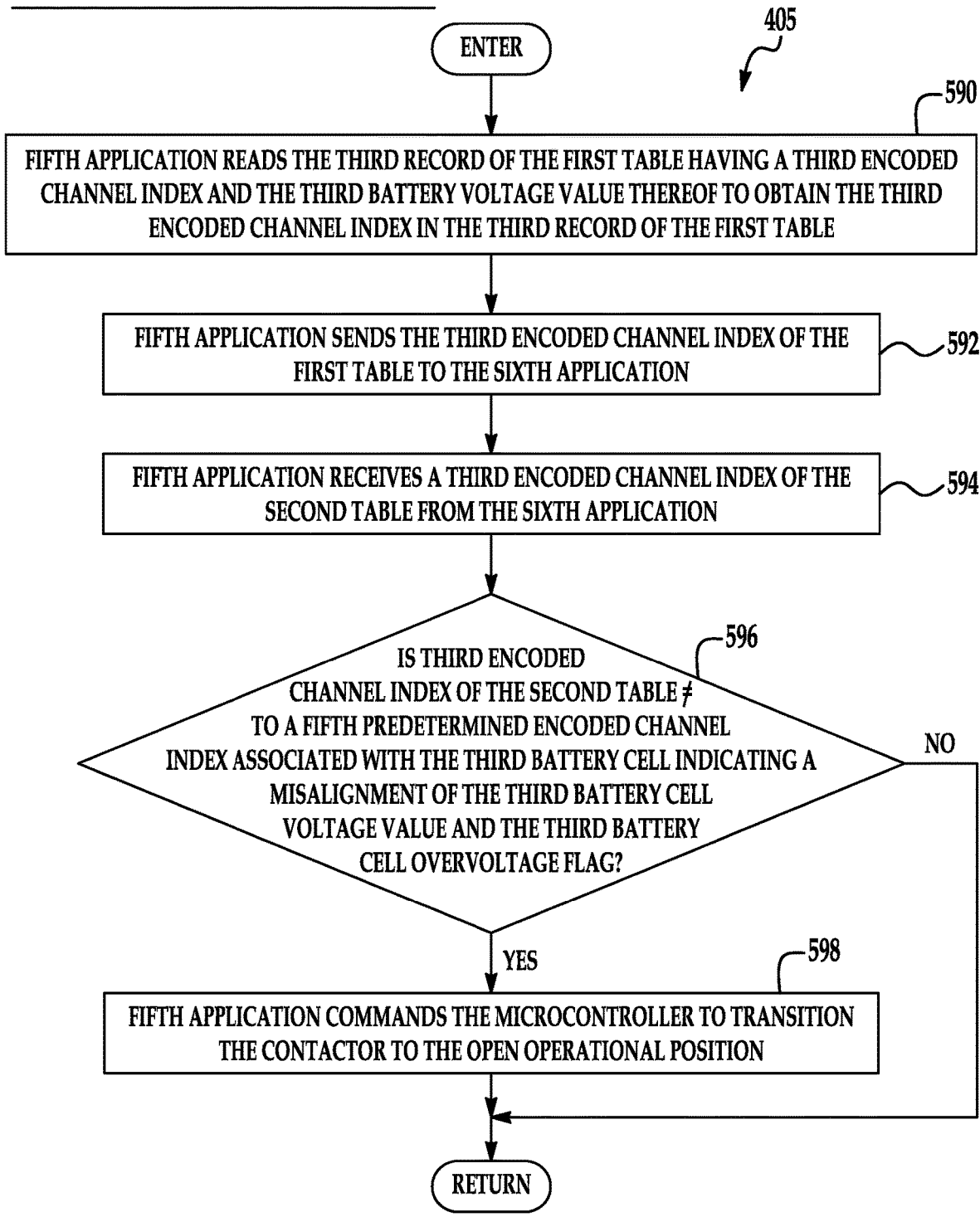

Referring to FIGS. 2 and 12, the fifth application 405 associated with the battery cell 93 will now be explained.

At step 590, the fifth application 405 reads the third record 344 of the first table 310 having a third encoded channel index (e.g., 7D hexadecimal) and the third battery voltage value (e.g., 4.8 decimal) thereof to obtain the third encoded channel index in the third record 344 of the first table 310. After step 590, the method advances to step 592.

At step 592, the fifth application 405 sends the third encoded channel index (e.g., 7D hexadecimal) of the first table 310 to the sixth application 406. After step 592, the method advances to step 594.

At step 594, the fifth application 405 receives a third encoded channel index (e.g., BE hexadecimal) of the second table 312 from the sixth application 406. After step 594, the method advances to step 596.

At step 596, the fifth application 405 makes a determination as to whether the third encoded channel index (e.g., BE hexadecimal) of the second table 312 is not equal to a fifth predetermined encoded channel index associated with the battery cell 93 indicating a misalignment of the third battery cell voltage value (e.g., 4.8 decimal) and the third battery cell overvoltage flag (e.g., 0 binary). If the value of step 596 equals "yes", the method advances to step 598. Otherwise, the method returns to the main application 400.

At step 598, the fifth application 405 commands the microcontroller 210 to transition the contactor 40 to the open operational position. After step 598, the method returns to the main application 400.

Figure 13:
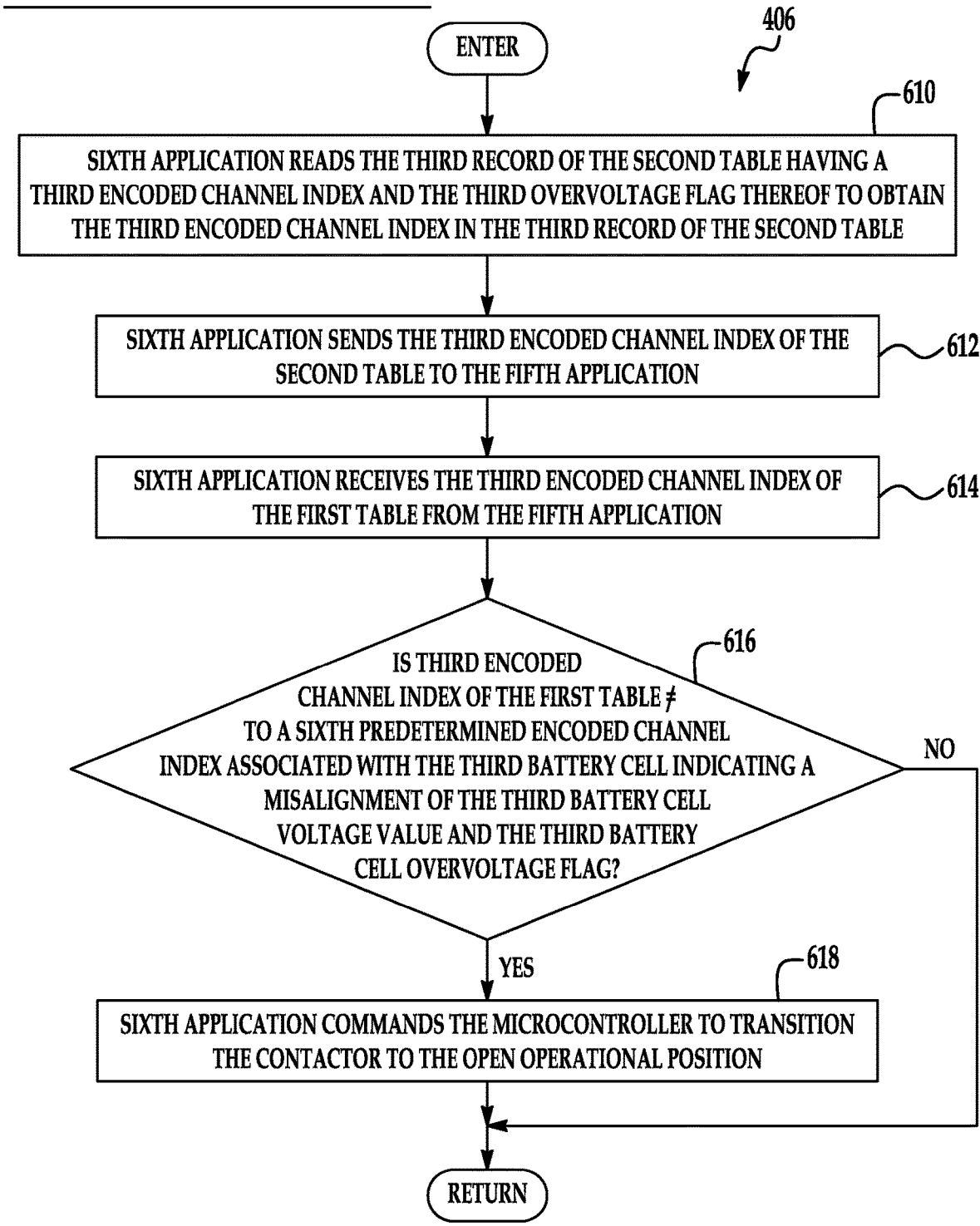

Referring to FIGS. 2 and 13, the sixth application 406 associated with the battery cell 93 will now be explained.

At step 610, the sixth application 406 reads the third record 374 of the second table 312 having a third encoded channel index (e.g., BE hexadecimal) and the third overvoltage flag (e.g., 0 binary) thereof to obtain the third encoded channel index (e.g., BE hexadecimal) in the third record 374 of the second table 312. After step 610, the method advances to step 612.

At step 612, the sixth application 406 sends the third encoded channel index (e.g., BE hexadecimal) of the second table 312 to the fifth application 405. After step 612, the method advances to step 614.

At step 614, the sixth application 406 receives the third encoded channel index (e.g., 7D hexadecimal) of the first table 310 from the fifth application 405. After step 614, the method advances to step 616.

At step 616, the sixth application 406 makes a determination as to whether the third encoded channel index (e.g., 7D hexadecimal) of the first table 310 is not equal to a sixth predetermined encoded channel index associated with the battery cell 93 indicating a misalignment of the third battery cell voltage value (e.g., 4.8 binary) and the third battery cell overvoltage flag (e.g., 0 binary). If the value of step 616 equals "yes", the method advances to step 618. Otherwise, the method returns to the main application 400.

At step 618, the sixth application 406 commands the microcontroller 210 to transition the contactor 40 to the open operational position. After step 618, the method returns to the main application 400.

Figure 14:
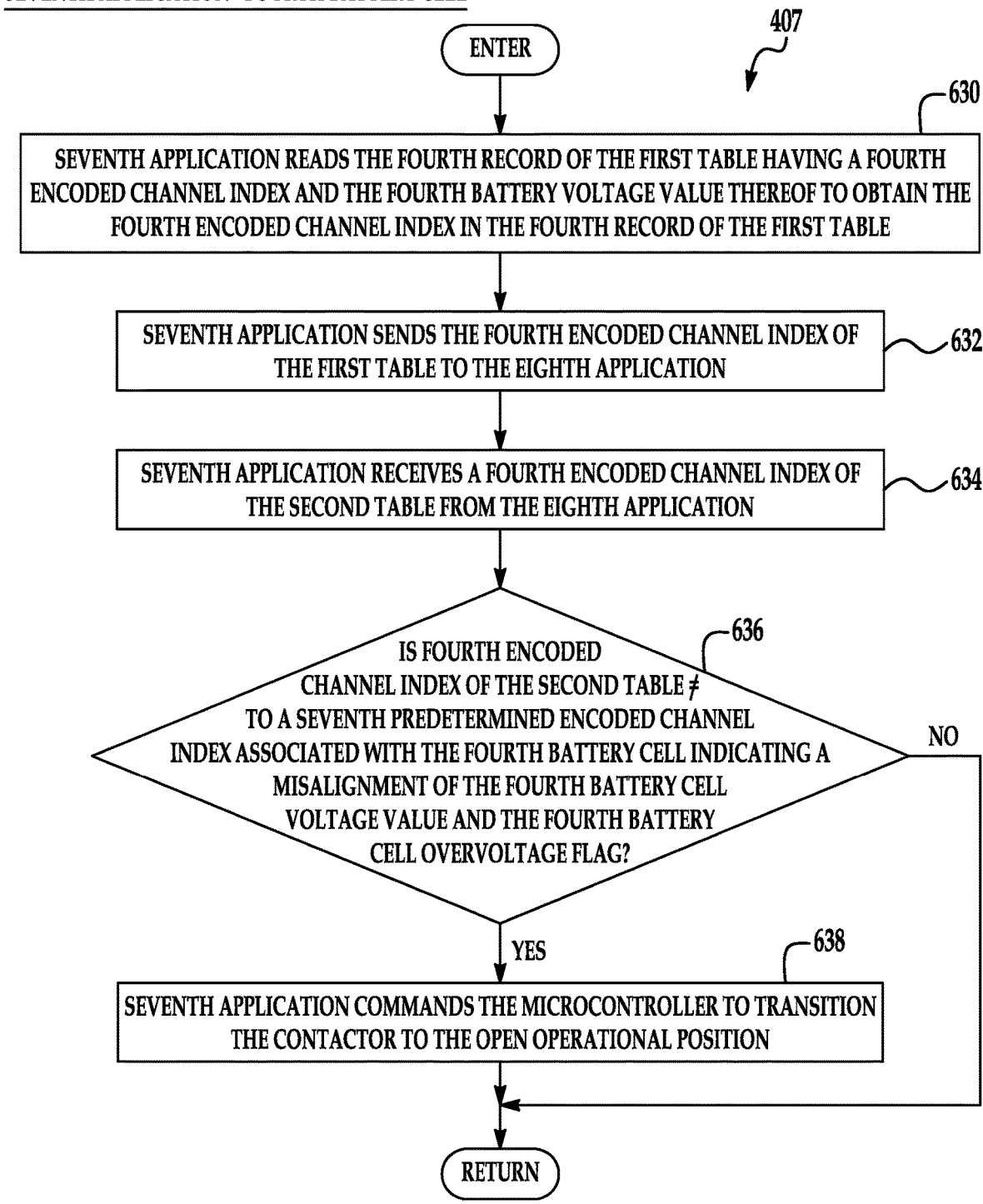

Referring to FIGS. 2 and 14, the seventh application 407 associated with the battery cell 94 will now be explained.

At step 630, the seventh application 407 reads the fourth record 346 of the first table 310 having a fourth encoded channel index (e.g., D4 hexadecimal) and the fourth battery voltage value (e.g., 4.9 decimal) thereof to obtain the fourth encoded channel index (e.g., D4 hexadecimal) in the fourth record 346 of the first table 310. After step 630, the method advances to step 632.

At step 632, the seventh application 407 sends the fourth encoded channel index (e.g., D4 hexadecimal) of the first table 310 to the eighth application 408. After step 632, the method advances to step 634.

At step 634, the seventh application 407 receives a fourth encoded channel index (e.g., E7 hexadecimal) of the second table 312 from the eighth application 408. After step 634, the method advances to step 636.

At step 636, the seventh application 407 makes a determination as to whether the fourth encoded channel index (e.g., E7 hexadecimal) of the second table 312 is not equal to a seventh predetermined encoded channel index associated with the battery cell 94 indicating a misalignment of the fourth battery cell voltage value (e.g., 4.9 decimal) and the fourth battery cell overvoltage flag (e.g., 0 binary). If the value of step 636 equals "yes", the method advances to step 638. Otherwise, the method returns to the main application 400.

At step 638, the seventh application 407 commands the microcontroller 210 to transition the contactor 40 to the open operational position. After step 638, the method returns to the main application 400.

Figure 15:
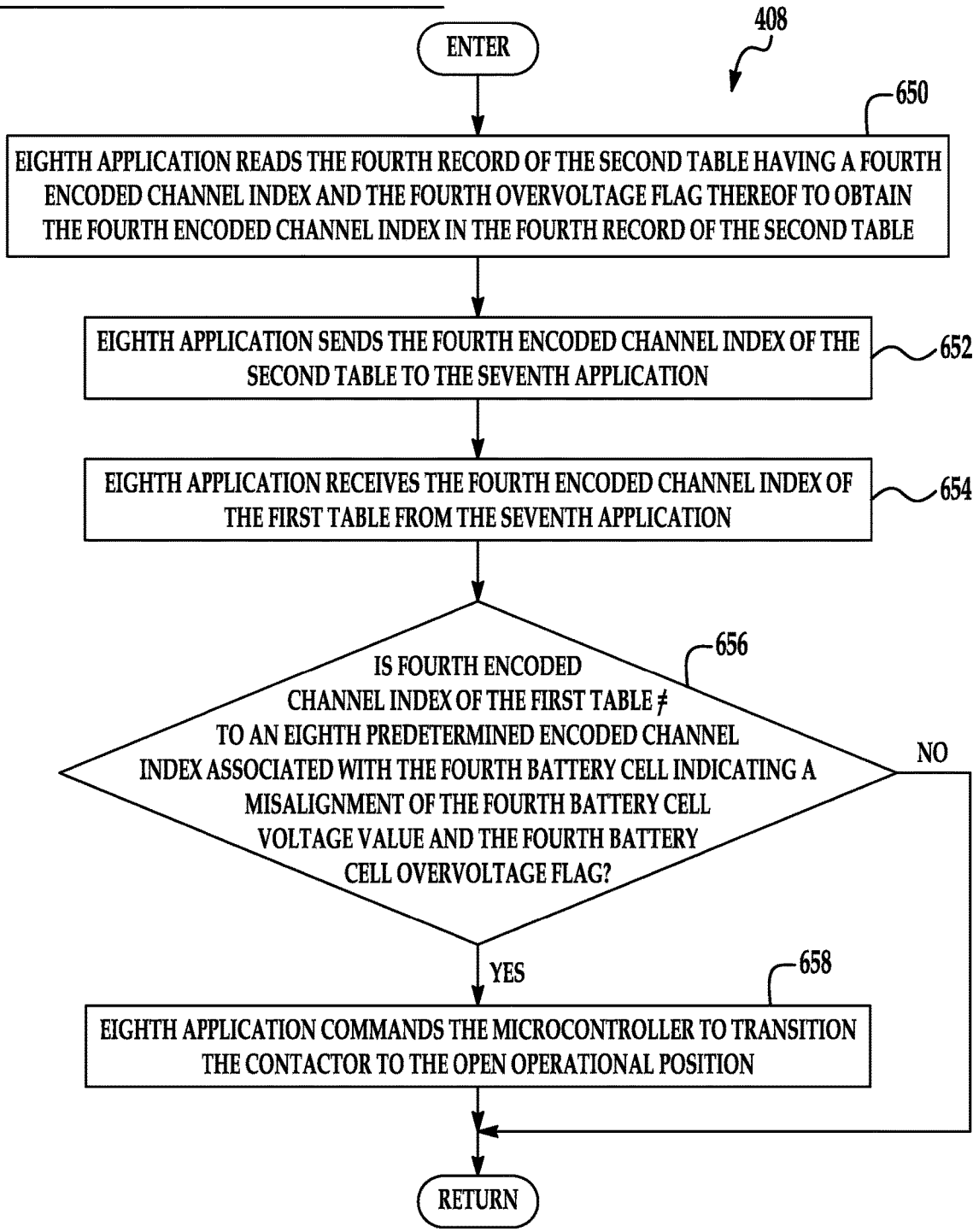

Referring to FIGS. 2 and 15, the eighth application 408 associated with the battery cell 94 will now be explained.

At step 650, the eighth application 408 reads the fourth record 376 of the second table 312 having a fourth encoded channel index (e.g., E7 hexadecimal) and the fourth overvoltage flag (e.g., 0 binary) thereof to obtain the fourth encoded channel index in the fourth record 376 of the second table 312. After step 650, the method advances to step 652.

At step 652, the eighth application 408 sends the fourth encoded channel index (e.g., E7 hexadecimal) of the second table 312 to the seventh application 407. After step 652, the method advances to step 654.

At step 654, the eighth application 408 receives the fourth encoded channel index (e.g., D4 hexadecimal) of the first table 310 from the seventh application 407. After step 654, the method advances to step 656.

At step 656, the eighth application 408 makes a determination as to whether the fourth encoded channel index (e.g., D4 hexadecimal) of the first table 310 is not equal to an eighth predetermined encoded channel index associated with the battery cell 94 indicating a misalignment of the fourth battery cell voltage value (e.g., 4.9 decimal) and the fourth battery cell overvoltage flag (e.g., 0 binary). If the value of step 656 equals "yes", the method advances to step 658. Otherwise, the method returns to the main application 400.

At step 658, the eighth application 408 commands the microcontroller 210 to transition the contactor 40 to the open operational position. After step 658, the method returns to the main application 400.

The battery management system described herein provides a substantial advantage over other battery management systems. In particular, the battery management system described herein as a technical effect of utilizing at least first and second applications that exchange first and second encoded channel indexes, respectively, with one another to detect data misalignment between battery cell voltage values and battery cell overvoltage flags.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery management system that detects data misalignment of battery cell voltage values and battery cell overvoltage flags, comprising:
    a microcontroller having first and second applications and first and second tables;
    the first table having a first record with a first encoded channel index and a first battery cell voltage value associated with a first battery cell;
    the second table having a first record with a first encoded channel index and a first battery cell overvoltage flag associated with the first battery cell;
    the first application reading the first record of the first table to obtain the first encoded channel index in the first table;
    the first application sending the first encoded channel index from the first table to the second application; and
    the second application commanding the microcontroller to transition a contactor to an open operational position, when the first encoded channel index from the first table is not equal to a first predetermined encoded channel index associated with the first battery cell indicating a data misalignment of the first battery cell voltage value and the first battery cell overvoltage flag.

2. The battery management system of claim 1, wherein:
    the second application reading the first record of the second table to obtain the first encoded channel index in the second table;
    the second application sending the first encoded channel index from the second table to the first application; and
    the first application commanding the microcontroller to transition the contactor to the open operational position, when the first encoded channel index from the second table is not equal to a second predetermined encoded channel index associated with the first battery cell indicating the data misalignment of the first battery cell voltage value and the first battery cell overvoltage flag.

3. The battery management system of claim 1, wherein the first encoded channel index has a Hamming distance of at least four from the second encoded channel index.

4. The battery management system of claim 1, wherein the first encoded channel index is a hexadecimal value.

5. The battery management system of claim 1, wherein the first battery cell overvoltage flag is a binary value.

6. The battery management system of claim 1, wherein the first encoded channel index in the first table is not equal to the first encoded channel index in the second table.

7. The battery management system of claim 1, wherein the first table having a second record with a second encoded channel index and a second battery cell voltage value associated with a second battery cell;
    the second table having a second record with a second encoded channel index and a second battery cell overvoltage flag associated with the second battery cell;
    the first application reading the second record of the first table to obtain the second encoded channel index in the second table;
    the first application sending the second encoded channel index from the first table to the second application; and
    the second application commanding the microcontroller to transition the contactor to the open operational position, when the second encoded channel index from the first table is not equal to a third predetermined encoded channel index associated with the second battery cell indicating a data misalignment of the second battery cell voltage value and the second battery cell overvoltage flag.

8. The battery management system of claim 7, wherein:
    the second application reading the second record of the second table to obtain the second encoded channel index in the second table;
    the second application sending the second encoded channel index from the second table to the first application; and
    the first application commanding the microcontroller to transition the contactor to the open operational position, when the second encoded channel index from the second table is not equal to a fourth predetermined encoded channel index associated with the second battery cell indicating the data misalignment of the second battery cell voltage value and the second battery cell overvoltage flag.

9. The battery management system of claim 1, further comprising:
    a battery cell voltage measurement IC measuring a voltage being output by the first battery cell; and
    the battery cell voltage measurement IC sending the first battery cell voltage value to the microcontroller.

10. The battery management system of claim 1, further comprising:
    a battery cell voltage measurement IC determining whether a voltage being output by the first battery cell is greater than a threshold voltage;
    the battery cell voltage measurement IC setting a first battery cell overvoltage flag equal to a fault value if the voltage being output by the first battery cell is greater than the threshold voltage; and
    the battery cell voltage measurement IC sending the first battery cell overvoltage flag to the microcontroller.

11. The battery management system of claim 1, wherein the battery cell voltage measurement IC operably communicates with the microcontroller utilizing a communication bus.

* * * * *